(12) United States Patent
Kretzschmar et al.

(10) Patent No.: US 8,499,018 B2
(45) Date of Patent: Jul. 30, 2013

(54) SORTABLE FLOATING POINT NUMBERS

(75) Inventors: Klaus Kretzschmar, Angelbachtal (DE); Nobuyoshi Mori, Lorsch (DE)

(73) Assignee: SAP AG, Walldorf (DE)

( * ) Notice: Subject to any disclaimer, the term of this patent is extended or adjusted under 35 U.S.C. 154(b) by 423 days.

(21) Appl. No.: 12/852,064

(22) Filed: Aug. 6, 2010

(65) Prior Publication Data

US 2010/0306289 A1    Dec. 2, 2010

Related U.S. Application Data

(62) Division of application No. 11/400,339, filed on Apr. 6, 2006, now Pat. No. 7,797,360.

(51) Int. Cl.
*G06F 7/00* (2006.01)

(52) U.S. Cl.
USPC .......................................................... 708/204

(58) Field of Classification Search
USPC .......................................................... 708/204
See application file for complete search history.

(56) References Cited

U.S. PATENT DOCUMENTS

| | | | |
|---|---|---|---|
| 6,907,435 B2 * | 6/2005 | Coulson et al. | 707/752 |
| 7,362,765 B1 * | 4/2008 | Chen | 370/395.4 |
| 2005/0165768 A1 * | 7/2005 | Coulson et al. | 707/3 |
| 2006/0047739 A1 * | 3/2006 | Schulte et al. | 708/495 |

OTHER PUBLICATIONS

Draft IEEE Standard for Floating-Point Arithmetic P754/D0.16.4 Mar. 30, 2006.
Draft Standard for Floating-Point Arithmetic P754, IEEE Standards Activities Department (2006).

* cited by examiner

*Primary Examiner* — Tan V. Mai
(74) *Attorney, Agent, or Firm* — Kenyon & Kenyon LLP

(57) ABSTRACT

The invention comprises methods for manipulating floating point numbers on a microprocessor where the numbers are sortable. That is, the numbers obey lexicographical ordering. Hence, the numbers may be quickly compared using bit-wise comparison functions such as memcmp( ). Conversion may result in a sortable floating point number in the form of a sign, leading bits of the exponent, and sets of digit triples in the form of declets (sets of 10 bits). In a variable-length version, numbers may be compressed by storing the number of trailing zero declets in lieu of storing the zero declets themselves.

8 Claims, 10 Drawing Sheets

SORTABLE FLOATING POINT NUMBERS

CROSS-REFERENCE TO RELATED APPLICATIONS

This is a Divisional Application of U.S. Utility application Ser. No. 11/400,339, filed Apr. 6, 2006, which is incorporated herein in its entirety.

BACKGROUND

Efficient representation and manipulation of numbers in computer systems presents many challenges for computer scientists and mathematicians. The goal of this art is to find a internal computer representation of numbers that:

Makes efficient use of computer storage (stores the numbers in as few bits as possible.)

Permits easy conversion to numbers for other operations (e.g., ASCII for display to users).

Permits fast numerical computation.

To reconcile these goals, some computers and devices adopt the binary-coded decimal ("BCD") representation. A BCD representation stores two decimal digits in a binary byte (8 binary bits). Each byte in the BCD representation is broken down into two groups of four bits. One decimal digit may be represented in each group of four bits. Thus, a 10 digit decimal number requires five bytes of storage in the BCD format.

One of the particularly attractive features of the BCD format is the ability to convert BCD numbers to decimal numbers. Since each BCD number represents discrete decimal digits (one digit in four bits), it is relatively simple to determine the value of each group of four binary bits to determine the decimal number of the corresponding decimal digit.

Despite widespread adoption of this representation, microprocessor manufacturers have been slow to formally adopt the BCD representation. BCD manipulations have thus largely been performed in software, as opposed to hardware. What prevents manufacturers from including BCD manipulation hardware in their processors is the lack of a formalized standard for representing floating point numbers in BCD form. Following the codification of a standard, the software manufacturers and database manufacturers can make greater investments in such a format. With widespread adoption comes investment from microprocessor manufacturers in the BCD format.

The emergence of the IEEE 754R representation ("754R") addresses the standardization of BCD floating point numbers. At the time of this writing, 754R has reached the final stages of standardization. In the near future, it is predicted that virtually all computer manipulations will be performed in the 754R format. Of course, there will be considerable latency between the time that IEEE 754R is ratified and the time that hardware support for this standard is commercially available. Current microprocessors do not possess hardware support for this new standard.

Without dedicated hardware support, 754R presents significant challenges to processor manufacturers and software developers who require specific types of calculations to be fast. For example, it is computationally expensive to compare two 754R values to determine which value has the greater or lesser value. Database queries, which are required to return their responses in an exceptionally short amount of time, cannot afford to absorb the additional processing time needed to manipulate numbers stored in the 754R format. Similarly, data sort operations are extremely expensive. Without sortability in database systems, 754R numbers may also be unable to serve as key fields in tables without implementing expensive software operations to convert the 754R numbers to a sortable format. Thus, there is a need in the art to provide a mechanism for legacy microprocessors and the like to process data in the 754R format but also provide for fast data comparison operations.

DETAILED DESCRIPTION

The present invention contemplates systems and methods for efficiently manipulating and comparing floating point numbers to render them amenable to bitwise comparisons. According to an embodiment of the invention, floating point numbers may be converted to a sortable floating point format ("SFP") in which a first field stores data representing the number's sign, a second field stores data representing the number's exponent and a third field represents the number's significand. Data in these fields may be organized in binary declets, groups of ten bits. Each declet may represent three decimal digits. Such a conversion permits BCD floating point representations of a certain bit length (e.g., 32-, 64- or 128- bits) to be represented in a SFP format with the same bit length. In another embodiment, numbers may further be compressed by add-biasing all declets by a predetermined number and storing the number of trailing zero declets (declets containing all zeros).

The present invention introduces three exemplary, fixed-length formats with different lengths: decimal32 (32 bit), decimal64 (64 bit), and decimal128 (128 bit) encoding. The invention contemplates fix-length representations of other lengths as well. The present invention also introduces a variable-length encoding which results in a compression factor of up to four for 128 bit numbers.

The present invention provides several advantages over the 754R format. First, software comparisons in the SFP format are markedly improved over those for the 754R format because they permit bit-wise comparison functions, such as memcmp( ). Additionally, as noted above, the SFP representation maintains the same bit length as the 754R representation. Thus, a 128 bit number in 754R format can be converted to an SFP format that is 128 bits. Third, SFP numbers may be compressed, thereby significantly reducing storage requirements for such numbers. For example, for the 128-bit format of SFP, a compression factor of four may be realized. Finally, coming on the heels of standardization, the processing system of the present invention, including the possibility to map the 754R numbers to existing native binary database types permits database manufacturers and other developers to use the 754R format without waiting for hardware manufacturers to provide processors with dedicated support for the new format.

Figure 1:
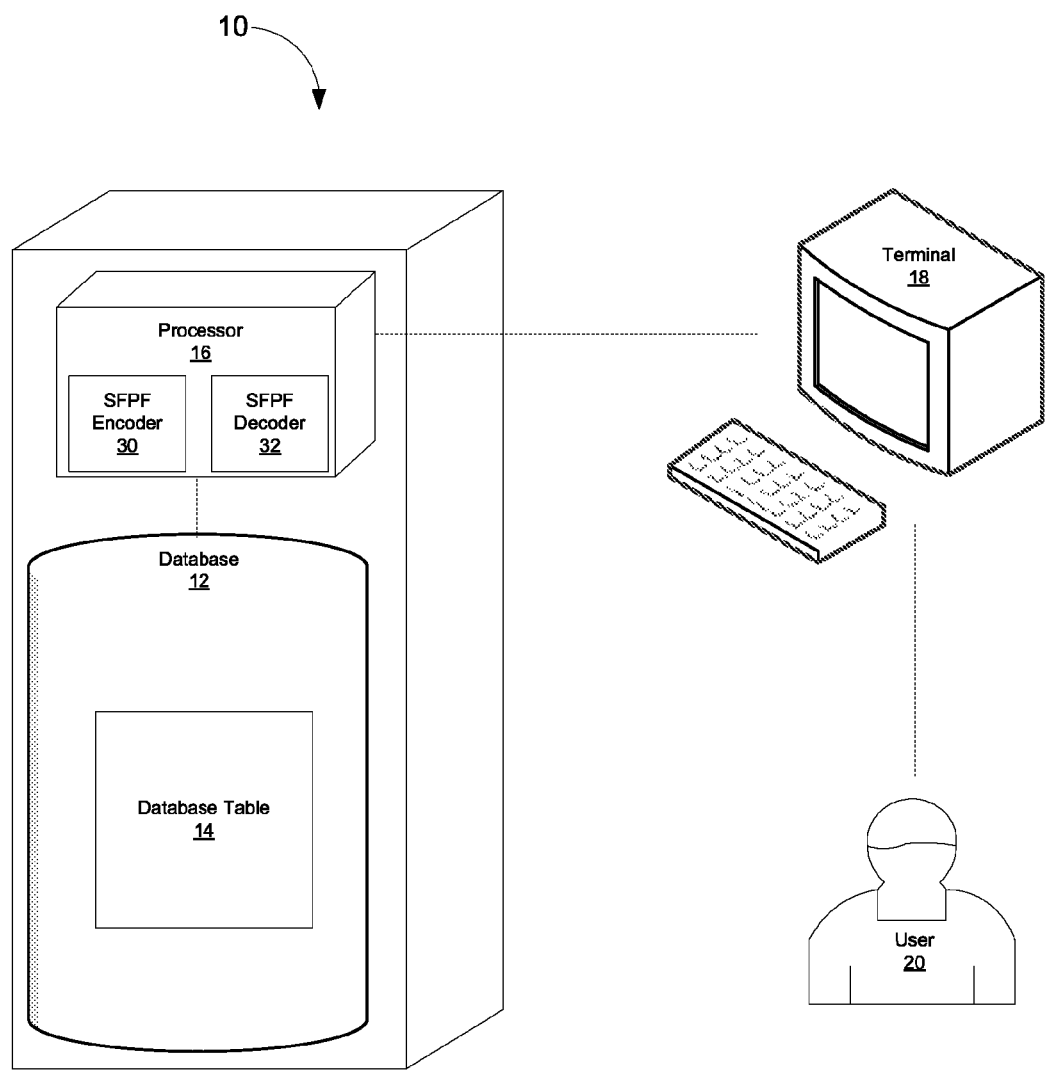
FIG. 1 depicts an illustrative system of the present invention.

FIG. 1 depicts an exemplary system 10 of the present invention. The system 10 contains a database 12 with database table 14 and database processor 16. An interface terminal 18 is shown in communication with the database processor 16. The processor 16 is shown with SFP encoding software 30 and SFP decoding software 32. A user 20 is shown querying the database 12 via database interface program 22 on the terminal 18.

Numbers may be stored in database table 14 in the SFP format. The database processor 16, using SFP encoder 30, may encode numbers arriving to be stored in the SFP format. The database processor 16 may use memcmp( ) to compare numbers within the database, in response to a query. The performance of memcmp( ) is very fast, and thus database queries are likewise very fast.

The following depicts illustrative, general steps carried out by microprocessors encoding and decoding numbers of the present invention.

To begin, any floating point number may be represented with three fields:
sign (S)—whether the number is positive or negative,
exponent—a power of 10, and
significand—the significant portion of the number.
For example, the number 86000 may be rewritten as $8.6\ 10^5$. The sign is positive, the exponent is 5, and the significand is 8.6000.

Figure 2:
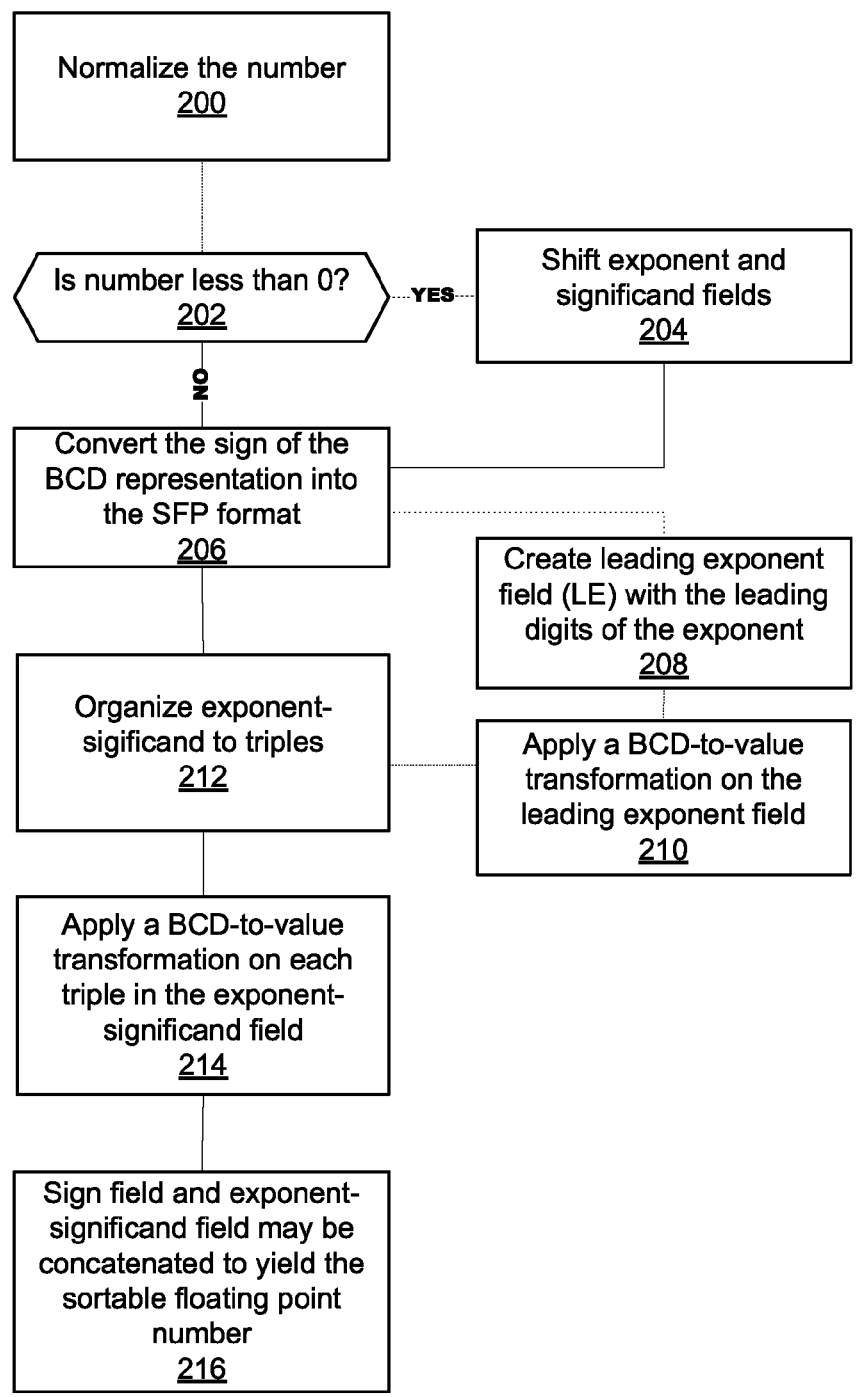
FIG. 2 depicts illustrative steps of an exemplary embodiment of the present invention.

FIG. 2 is a flowchart illustrating a conversion method for a number coded as sign, exponent and significand, according to an embodiment of the present invention. In step 200, the method optionally normalizes the number to be encoded to align the decimal point of a significand portion and adjust the exponent accordingly. Normalization fixes the radix point of all numbers in a processing system and, therefore, makes a bitwise comparison between values possible. Note that step 200 may be optional. The algorithm may take in a number which has already been normalized.

In step 202, the method determines if the number is less than 0 and, if so, it shifts the exponent and/or significand fields to preserve lexicographical ordering for bitwise comparison (step 204). When two negative numbers have the same exponent, the number with the higher significand actually has the lower value (e.g., $-2.2*10^1$ is less than $-1.1*10^1$ ($-22<-11$) even though the significand 2.2 is greater than 1.1). The shift may overcome this artifact, which can promote bitwise comparisons among negative numbers.

The shift likewise performs an inverse shift operation on the exponent to also permit lexicographical comparison of the negative numbers. For example, $-2.0\ 10^3$ is greater than $-2.0\ 10^4$. Proper lexicographical comparison of these numbers must perform an inverse operation on the exponents so that the encoded format of the exponent 4 is less than the encoded format of the exponent 3.

In step 206, the method may convert the sign-bit of the BCD representation into the SFP format. To promote lexicographical ordering, a bit value of 0 may be taken to have than a bit value of 1. Therefore, the sign-bit of negative numbers may be 0 and the sign-bit of positive numbers may be 1 to permit lexicographical comparison functions to properly order the negative and positive numbers.

In step 212, the exponent-significand may be organized into triplets, groups of three decimal digits (e.g., 123456 converts to two triples: 123 and 456). In step 214, BCD-to-value transformations may be applied on each triplet in the exponent-significand field (obtains the binary equivalent of the triple).

A first BCD-to-value transformation may convert the BCD digits into their 10-bit, binary representations. The transform finds the binary equivalent of the value represented by the BCD coding. Using the triplet "012" as an example, the transformation obtains the binary value 00 0000 1100. Table 1 illustrates transformations that may occur in response to input BCD values.

TABLE 1

| DECIMAL VALUE OF BCD TRIPLET | BINARY BIT PATTERN OF BCD TRIPLET | VALUE OF BCD BIT PATTERN REPRESENTED IN BINARY | BINARY TRANSFORMATION OF TRIPLET |
|---|---|---|---|
| 256 | 0010 0101 0110 | 598 | 10 000 0000 |
| 730 | 0111 0011 0000 | 1840 | 10 1101 1010 |
| 897 | 1000 1001 0111 | 2199 | 11 1000 0001 |

Note that the binary bit pattern of a BCD triplet, if it were interpreted directly as a binary number, would resolve to an incorrect value (in Table 1, BCD 256 has a value of 598). The BCD-to-binary transformation collapses the BCD representation of a value to its proper value in binary.

Once the exponent-significand field has been created, the sign field and exponent-significand field may be concatenated to yield the sortable floating point number (Step 216).

In alternative embodiments, a sortable floating point number may contain a leading exponent field. In step 208, the method may optionally create a leading exponent field (LE) with the leading digits of the exponent. Each representation of numbers of a particular number of bits contains remainder bits. The invention may group digits, as below described, into groups of 10 bits called declets. In a 64 bit representation, 60 bits may be taken up by 6 declets. After reserving one sign bit, three bits may remain to encode a leading digit of the exponent and may encode at most one digit. For 32-bit numbers, one bit may remain (encoding one digit of the exponent) and for 128-bit numbers, 7 bits may remain (encoding three digits).

In step 210, the method may optionally apply a second BCD-to-binary value transformation on the leading exponent digits, which obtains the binary equivalent of the decimal number represented by the BCD encoding. This transformation may be used to retrieve the binary representation of the correct number of bits of the leading digits of the exponents so that the binary bits may later be included in the final SFP number.

In an alternative embodiment, the first two digits of the first declet of the exponent-significand field may be the trailing two digits of the exponent. Therefore, a 64-bit number, may have an exponent of 799, 7 represented by the 3 bits of the LE field and 99 encoded as the first two digits of the exponent-significand field.

Consider the foregoing operation in the context of an exemplary number originally encoded as a BCD representation of the 64-bit normalized number 2.000000000000000 $10^{401}$. This may be encoded as follows:

TABLE 2

| | | WIDTH | |
|---|---|---|---|
| | 1 BIT | L BITS | K * 10 BITS |
| Field | S | $L_E$ | EXPONENT - SIGNIFICAND |
| Bit string | 1 | 100 | 0000001100 0000000000 0000000000 ... |

In step 208, the processor may retrieve the LE digits. Since the number is 64-bit, the exponent may have 3 digits and may have one digit of the LE field in SFP format. Thus, the exponent may be 401. The LE digit, the first digit of the exponent in 64-bit numbers, is 4. Applying step 210, the processor may simply convert one BCD digit bit pattern into its equivalent binary bit pattern. In the case of one BCD digit, the binary equivalent may be retrieved by taking the three least significant bits of the BCD bit pattern. The BCD representation of the digit 4, 0100, may be converted to its binary representation, 100.

Grouping the remainder of the exponent digits and the significand into triplets by applying step 212 may yield

TABLE 3

| FIELD | SIGN BIT | LE DIGITS | EXPONENT-SIGNIFICAND DIGITS |
|---|---|---|---|
| digits | 1 | 4 | 012 000 000 000 ... |

The first triple of the exponent-significand may contain the trailing two digits of the exponent, 01 as well as the first digit of the significand, 2 to yield 012. The next three digits of the significand are 000. Hence the next triple is 000, and so on.

The method may encode the all BCD triplets in binary. Since the remaining triples are 000, their binary representations are likewise all zeros.

Figure 3:
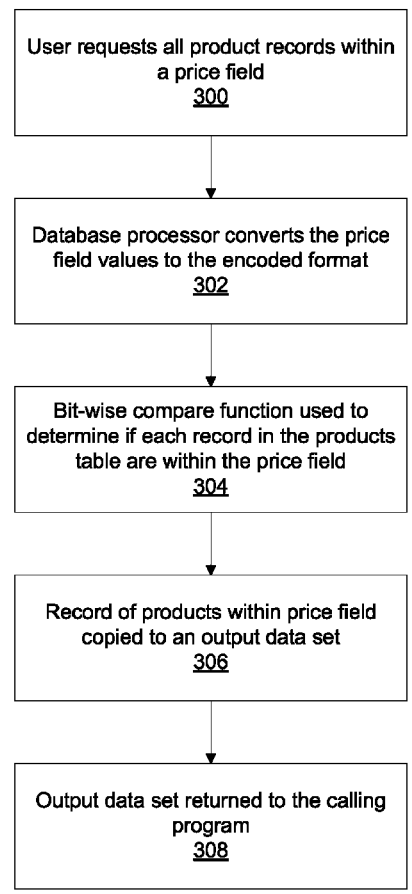
FIG. 3 depicts illustrative steps of another exemplary embodiment of the present invention.

Four use scenarios may highlight the SFP processing systems and methods of the present invention. First, in a database access scenario, a user may request the database to select all products in a product catalog database which cost more than $1.50 and less than $2.00. The user 20 of FIG. 1 may implement this scenario from a kiosk of a retail establishment. The user 20 may be represented with a form on the kiosk, the terminal 18, and may enter the appropriate range values on the form. Turning to FIG. 3, in step 300, from a calling program, the user terminal may generate and send a select statement to a database requesting all product records wherein the price field is greater than 1.50 and less than 2.00. For example, the select statement may be "select all from "Products" where "price">1.50 and "price"<2.00." In step 302, the database processor may convert the values 1.50 and 2.00 to the encoded format to arrive at the numbers SFP(1.50) and SFP (2.00) respectively. In step 204, for each record in the products table, use a bit-wise compare function (such as memcmp( ) to determine whether the value of the price field is greater than SFP (1.50) and less than SFP (2.00). In step 306, if so, copy the record to an output data set. In step 308, return the output data set to the calling program.

For a table with N products, utilizing the present invention may complete the select statement in a time of 2SN+e+d while a time of 2N would be required for the select using traditional 754R software comparison implementations. S may be the factor of savings gained by comparing two SFP numbers using memcmp as compared to software comparisons of 754R numbers. E may be the time it takes to encode the numbers 1.50 and 2.00 in the SFP format. D may be the decoding time to decode the price field of each record in the output data set. Thus, using an S factor of 0.1 yields a total savings of approximately 80 percent.

Figure 4:
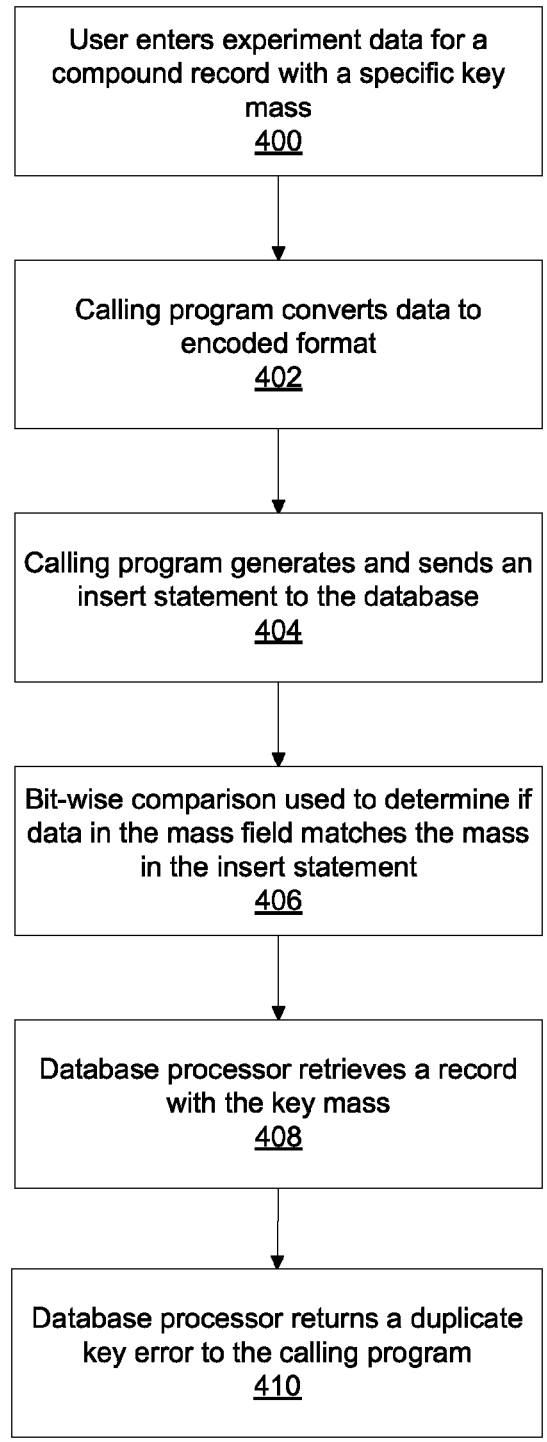
FIG. 4 depicts illustrative steps of another exemplary embodiment of the present invention.

In a second scenario, in a table storing experiment data for different compound mixtures keyed by mass of the compounds, demonstrate that an entry with a value of 10 should not create a new record when a record already exists with a key of 10.0. Turning to the flowchart of FIG. 4, in step 400, the user enters the experiment data for a compound record with a key mass of 10. In step 402, a calling program converts the data (including the key of 10) to encoded format (including SFP(10)). In step 404, the calling program generates and sends an insert statement with a key of encoded(10) to the database. In checking for duplicate keys in the table in step 406, for each table record, use a bit-wise comparison function (such as memcmp( ) to determine whether the data in the mass field matches the mass of encoded(10) in the insert statement (note that this comparison excludes examination of the scale variable). In step 408, the database processor retrieves a record with a key of SFP(10.0) (note that in ordinary databases this behavior may not occur because the internal representations for 10 and 10.0 may differ). In step 410, the database processor returns a duplicate key error to the calling program.

Figure 5:
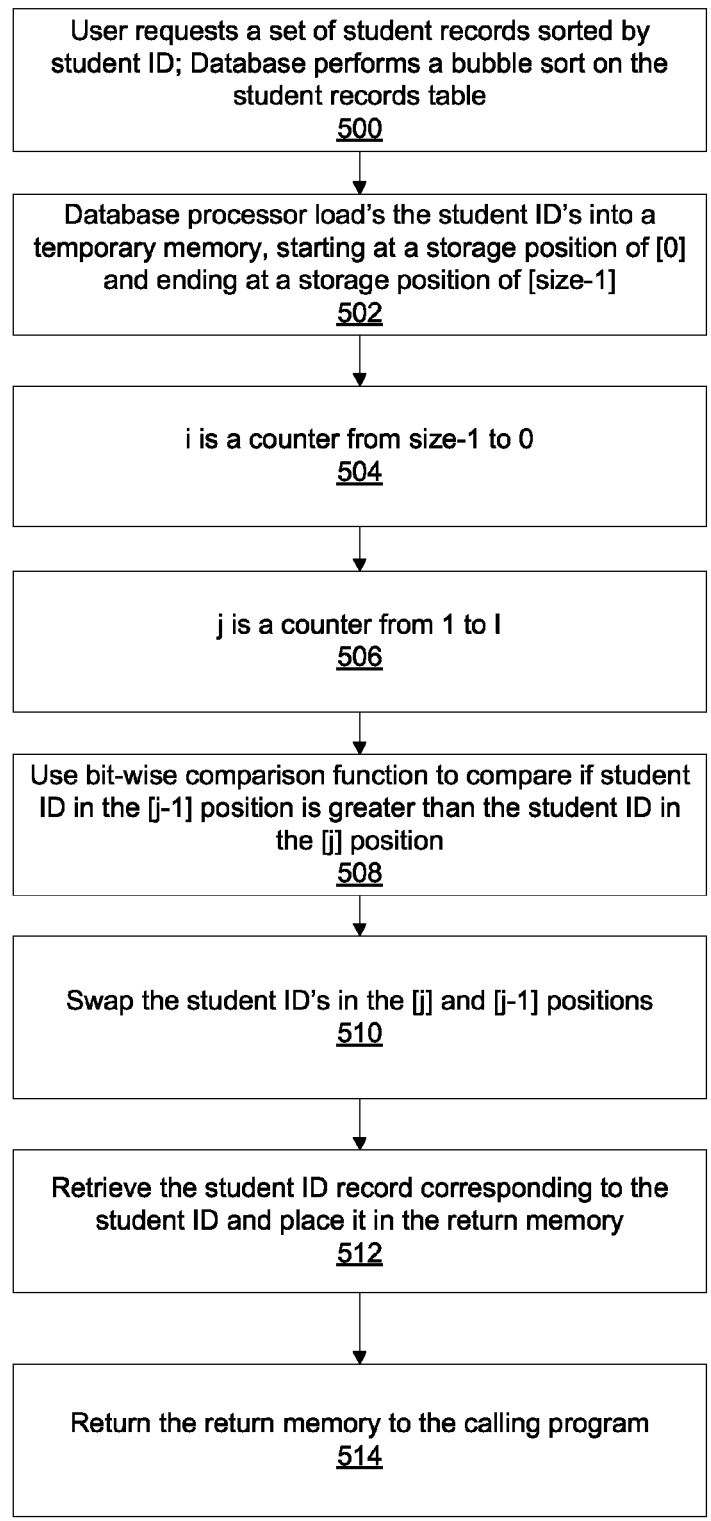
FIG. 5 depicts illustrative steps of the general encoding method.

In a third scenario, depicted in FIG. 5, the system sorts a set of student records in a table by student ID (using a bubble sort). In step 500, from a calling program, the terminal may generate and send a request to a database for a set of student records sorted by student ID. The database may perform a bubble sort (with a processing time of $O(N^2)$) on the student records table, where N is the time it takes to compare two ID's. In step 502, load the database processor may load the student ID's into a temporary memory, starting at a storage position of [0] and ending at a storage position of [size-1], where size is the number of student records in the database. In step 504, for i is a counter from size-1 to 0. In step 506, for j is a counter from 1 to i. In step 508, if the student ID in the [j-1] position is greater than the student ID in the [j] position, using a bit-wise comparison function (such as memcmp( ) for the comparison, then swap the student's ID in the [j] and [j-1] positions in step 510. Note that this algorithm performs comparisons on the order of n2. In step 512, after the sort is completed, for each student ID from the [0] position to the [size-1] position of the sorted, temporary memory, retrieve the student ID record corresponding to the student ID and place it into a return memory. In step 514, return the return memory to the calling program.

Using a time savings factor of 0.1, the above sort may save approximately 99 percent $((0.1N)^2=0.01N^2)$.

A fourth scenario highlights the compression of the variable-length aspect of the present invention. A database having the capacity of storing one billion 128 bit numbers would ordinarily consume approximately 15.3 gigabytes of disk space. Each 128-bit number consumes sixteen bytes of disk space. One billion of such numbers consume sixteen billion bytes, or 15.3 GB of disk space. With a compression factor of four using the variable-length encoding, the same database may be stored in as small as 3.8 GB of disk space.

Figure 10:
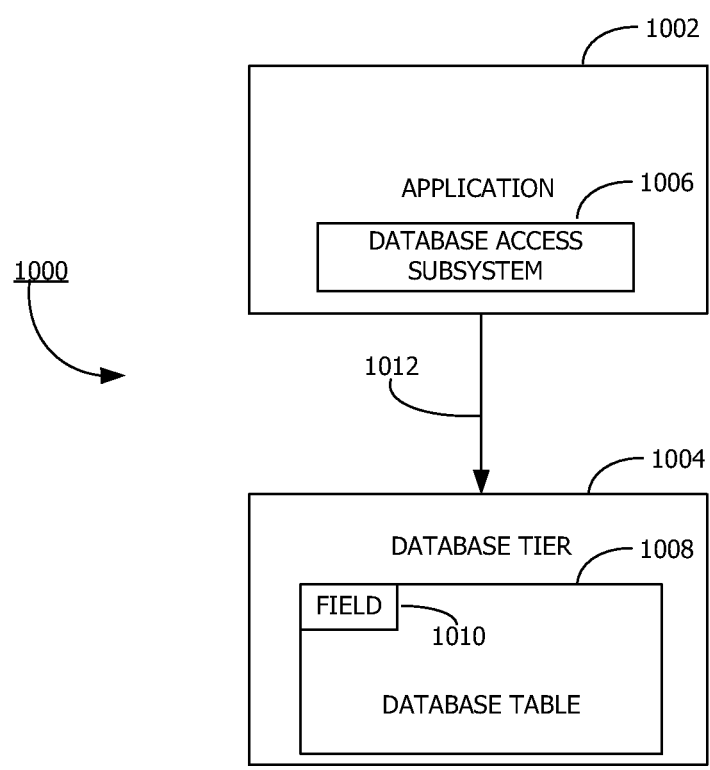
FIG. 10 depicts an application accessing a database tier according to an exemplary embodiment of the present invention.

It is important to note that two scenarios highlight the impact of the present invention. In a two-tiered scenario, the introduction of sortable floating point numbers makes it possible to develop high-level applications that perform operations on 754 numbers while permitting databases to store these numbers. In FIG. 10, an application level tier 1000 performs calculations on 754 numbers within an application 1002. For example, the application may be a sales order and delivery system. The application level tier may communicate with the database tier 1004 by way of a database access subsystem 1006 within application 1002. Application 1002 may pose a query 1012 to the database for all products costing $1.50. Within the database 1004, table 1008 may be accessed in response to a query from application 1002. Database table 1008 may contain field 1010.

Field 1010 must utilize data types native to the database 1004 because databases are relatively inflexible with rich data types. Databases typically contain 4-bit, 8-bit, and 16-bit binary data types for storing arbitrary, richer data types. It may be possible to map 754 numbers into these types directly. However, doing so renders databases unable to perform queries on the key fields to retrieve the requested data. The primary comparison function used by databases on the binary data types is memcmp( ). Since 754R numbers are not inherently sortable with respect to the memcmp( ) function, the database would be unable to retrieve data from query 1012 without (1) the database storing the data in a sortable format and (2) query 1012 presenting a sortable number for the database to use in fulfilling its query. Thus, introduction of the sortable floating point numbers permits application developers to begin development of applications using the 754 number format utilizing existing database systems.

In another scenario, a single tiered approach highlights performance gains realized by the present invention. Database manufacturers may wish to support native storage of 754 numbers. This means that database manufacturers may create rich data types which are able to capture the 754 number format. Databases may either compare 754 numbers natively or store an alternate representation of the numbers. In the first case, a software library may be used. However, the performance penalties in this approach make it unrealistic. In the second case, the database may create an alternate format used for comparisons. Since databases naturally use memcmp( ) for comparisons, it is advantageous to use an alternative format which is sortable. Introduction of sortable floating point numbers facilitates database support for 754 numbers.

Figure 6:
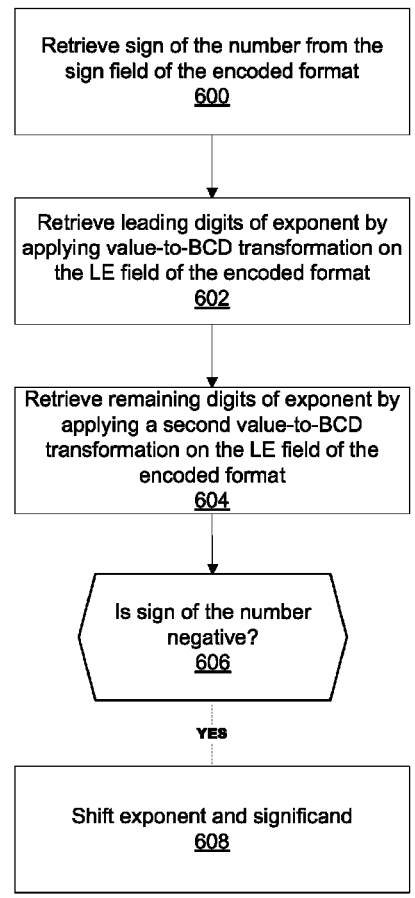
FIG. 6 depicts illustrative steps of the general decoding method.

FIG. 6 is a flowchart illustrating a decoding method according to an embodiment of the present invention. This method may generally invert the processes performed in FIG. 2. In step 600, the method may retrieve the sign of the number from the sign field of the number in the SFP format. The sign, as encoded, may be 0 if the SFP number is negative and 1 if positive.

In step 604, the method may retrieve the BCD digits of the exponent and the significand field by applying a first value-to-BCD transformation on the exponent-significand field of the encoded format (obtains the BCD equivalent of the binary representation of the declet). In other words, the first value-to-BCD transformation may convert a declet of 10-bits into 3 groups of four bits in BCD, each 4 bits representing each of the three digits encoded in binary of the declet.

In step 602, the method may optionally retrieve the leading digits of the exponent by applying a second value-to-BCD transformation on the LE field bits of the encoded format (obtains the BCD equivalent of the binary representation of the leading exponent digits). Each number of bit representations may contain varying numbers of bits depending on the bit representation. Thus, 1 bit may be retrieved for 32-bit numbers, 3 bits for 64-bit, and 7 bits for 128-bit numbers. The second value-to-BCD takes as input the LE field bits and outputs BCD digits corresponding thereto.

Optionally, in step 606, if the sign of the number is negative, then in step 608, the method may optionally shift the exponent and significand to restore the shift performed in the general encoding method. A shift may have been performed during encoding to permit lexicographical comparison of significands and exponents of negative numbers; the inverse shift operation may allow the number to be properly evaluated. Once the sign, exponent, and significand have been retrieved in the decoding method, they may be used to construct the original 754R number.

An example of the general decoding method may clarify the invention. The SPF number represented in Table 2 may be decoded into the normalized number 2.000000000000000 $10^{401}$. Applying step 600, the sign may be retrieved. Since the sign field contains a single bit set to 1, the normalized number is positive.

Applying step 602, the next three bits, 100, may be converted to the first digit of the exponent. Three bits may be retrieved because 64-bit numbers may contain a LE field of three bits. A second value-to-BCD transform, which may be the inverse of the second BCD-to-value transform described in conjunction with FIG. 2, may be applied to the three bits 100 to arrive at the BCD digit 0100 (which has a value of 4).

Applying step 604, the first declet of the SPF number, 0000001100 (which has a value of 12) may be converted to a three digit, BCD triple using a first value-to-BCD transformation to arrive at the original BCD digit triple. The first binary declet bit pattern (which has a value of 12) thus yields a 12 bit binary bit pattern of three 4-bit BCD digits with the values 0, 1, and 2 respectively. As with the exemplary, first BCD-to-value transformation, the exemplary, first value-to-BCD transformation may inherently convert the binary bit pattern in a declet to a BCD bit pattern. In a more understandable method, the first declet may be evaluated to arrive at the decimal value 12. A value-to-BCD transformation may be applied to convert the number 12 into the number 18. Grouping the binary bit pattern for the number 18 (000000010010) into 3 groups of 4 bits may yield the three BCD digits of 0, 1, and 2 respectively. The leading exponent digit, 4, may then be combined with the trailing exponent digits (from the first declet of the exponent-significand field), 01, to arrive at the full exponent 401. The remainder of the digits may thus be the full significand. The sign, exponent, and significand may then be combined in the 754R format.

Other embodiments of the present invention may provide further efficiencies by coding a floating point representation of a number in a variable length format. The variable length coding format can conserve resources within a computer system by storing coded numbers with higher data packing ratios than are permissible with the conventional IEEE 754R coding scheme or with the coding scheme of FIG. 5.

The variable encoding method may omit coding of trailing 0 declets in a significand and instead, may encode a run length of number of 0 declets. This thereby saves space ordinarily occupied by declets of trailing zeros.

In this embodiment, the variable SPF format may contain:
A sign field,
A leading exponent field,
An exponent-significand field, and
A field (Z) that represents the number of trailing 0 declets.

Figure 7:
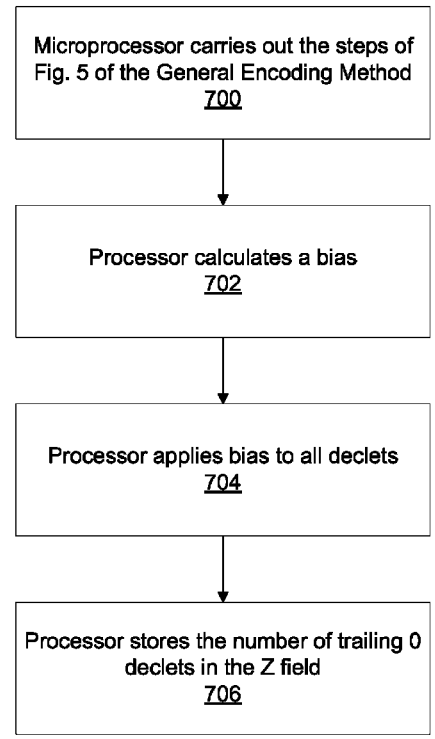
FIG. 7 depicts illustrative steps of the variable-length encoding method.

FIG. 7 represents illustrative steps for encoding numbers using the variable encoding method carried out by microprocessors of the present invention. In step 700, the microprocessor carries out the steps of FIG. 5 of the General Encoding Method. This yields an SPF number.

In step 702, the processor may calculate a bias, which may encode the declets of the SPF number so that the Z field may be distinguished from the remainder of the exponent-significand. For example, the bias may be calculated using the formula if the sign of the SPF number is greater than or equal to 0, $$val(d_{i+2},d_{i+1},d_i) \rightarrow 999-val(d_{i+2},d_{i+1},d_i), \text{where}$$

p is the number of possible digits of the significand. For 128-bit numbers, there may be 34 digits. Applying the bias formula yields 12.

Note that $val(\ldots 11010011) = 1*1*2^6 + 0*2^5 + 1*2^4 + 0*2^3 + 0*2^2 + 1*2^1 + 1*2^0$ In step 704, from most to least significant declet, the processor may apply the bias until the first declet containing trailing zeros is reached. For example, given a bias B, declets with the values $dec_1$, $dec_2$, and $dec_3$ may be biased by adding B to arrive at biased declets $dec_1+B$, $dec_2+B$, and $dec_3+B$.

In step 706, the processor may store the number of trailing 0 declets in a Z field. The Z field may comprise the most significant zero declet of the trailing zero declets. The bias, for example, may correspond to the number of trailing zero declets. Thus, any declet $dec_i$ that has a value greater than the bias may be known to be part of the exponent-significand. Arriving at a declet with a value less than or equal to the bias may indicate that the Z field has been reached. Thus, the bias helps to distinguished between declets containing the exponent-significand and the Z field.

The following example may help to illustrate the variable-length encoding method. To encode the 128-bit number 1.900000000000000000000000000000000 $10^{6179}$, (32 trailing zeros) the general encoding method may yield the number

TABLE 4

| | WIDTH | | | |
|---|---|---|---|---|
| | 1 BIT | 7 BITS | 2 * 10 BITS | 10 BITS |
| Field | S | $L_E$ | EXPONENT - SIGNIFICAND | Z |
| Bit string | 1 | 0111101 | 1100010111 1110000100 0000000000 . . . | xxxxxxxx |
| decimal values | | 61 | 791 900 000 . . . (decimal values of declets) | |

Applying step 702, the 128-bit number may yield a bias of 12 (see above).

Applying step 704, each declet may be biased with a bias of 12. The first declet, having a value of 791, may be added by 12 to yield 803. The second declet, having a value of 900, may be biased to yield 912. Biasing may yield

TABLE 5

| | WIDTH | | | |
|---|---|---|---|---|
| | 1 BIT | 7 BITS | 2 * 10 BITS | 10 BITS |
| FIELD | S | $L_E$ | EXPONENT - SIGNIFICAND | Z |
| Bit string | 1 | 0111101 | 1100100011 1110010000 0000000000 . . . | xxxxxxxx |
| decimal values | | 61 | 803 912 000 . . . (decimal values of declets) | |

Applying step 706, the number of trailing zero declets, 3, may be stored in the Z field, which may be the first 0 declet of the trailing 0 declets. There may be 10 trailing zero declets, 30 trailing zeros, 3 zeros per declet, yields 10 trailing zero declets. This may yield

TABLE 6

| | WIDTH | | | |
|---|---|---|---|---|
| | 1 BIT | 7 BITS | 2 * 10 BITS | 10 BITS |
| FIELD | S | $L_E$ | EXPONENT - SIGNIFICAND | Z |
| Bit string | 1 | 0111101 | 1100100011 1110010000 | 0000001010 |
| decimal values | | 61 | 803 912 (decimal values of declets) | 10 |

In an alternative embodiment, the first, most significant declet of the SFP number may not be biased. This declet may be significant because it may contain the trailing digits of the exponent not encoded in the LE field as well as the beginning digits of the significand. The first declet may not contain trailing zeros. There may be no danger of confusing the first declet for a declet of trailing zeros. Therefore, not biasing this first declet may optimize the variable-length encoding time.

Figure 8:
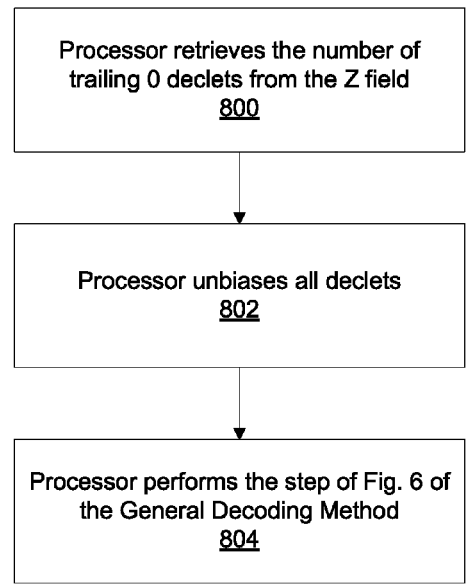
FIG. 8 depicts illustrative steps of the variable-length decoding method.
Figure 9:
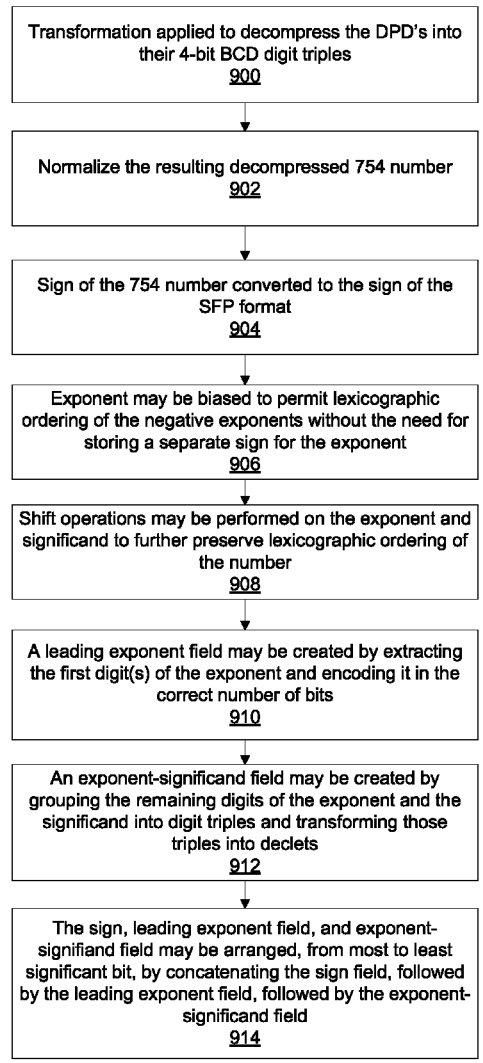
FIG. 9 depicts representative steps in a preferred embodiment of the present invention.

FIG. 8 represents illustrative steps carried out by the microprocessor in decoding numbers previously encoded using the variable length encoding method. In step 800, the processor may retrieve the number of trailing 0 declets from the Z field. The Z field may be distinguished because it may be the only declet which has a value less than or equal to the bias. Retrieving the number of trailing zeros may aid in reconstructing the precision of the original number.

In step 802, the processor may unbias all declets, from the second most significant declet to the last declet that contains portions of the exponent-significand field. This step returns the exponent-significand field to the format of the fix-length SFP format.

In step 804, the processor may perform the steps of FIG. 6 of the General Decoding Method to retrieve the normalized form of the number. The number of trailing zeros may be appended to the representation retrieved from the variable-length decoding to preserve the original precision.

An example may illustrate the variable-length decoding method. Applying step 800, to the number represented in Table 5, the first declet that does not contain exponent digits may be retrieved. Since that declet contains a value greater than the bias of 12, it may not contain the number of trailing zero declets. The second declet likewise is greater than the bias. The third declet, however, is 10, which is less than the bias. 10 is thus the number of trailing zeros. Locating the Z field may also signify the boundary of the number.

Applying step 802, the declets of the exponent-significand field may be unbiased. The first declet, having a value of 803, may be subtracted by the bias of 12 to yield 791. The second declet, having a value of 912, may be subtracted by the bias of 12 to yield 900. The third declet is less than the bias, and thus the unbiasing step may be finished.

Finally, in step 804, the SFP number may be augmented with the proper number of trailing zero declets, given by the value of the Z field, and the general decoding method may be performed to yield the number $1.9000000000000000000000000000000000 \ 10^{6179}$.

In an alternative embodiment, the normalized format of the BCD numbers may be described as follows.

Let $D \in Sign \times Digits^* \times Digits^*$ be a number representable in the form $(-1)^s \ 10^e \ f$, where:
the sign $s$ is 0 or 1
the exponent $e$ is an integer with $1-emax <= e <= emax$
the fractional significand $f$ is a number represented by $d_0. d_1 d_2 \ldots d_{p-1}$, where
p is the precision
$<d_0 <= 9$ and $0 <= d_i <= 9$ for $i=1 \ldots p-1$
Then D may be in a normalized floating-point format.

Example $$2000.00 = (decimal64) 200000 \ 10^{-2} = (normalization)$$
$$2.000000000000000 \ 10^3$$

It may be advantageous to normalize numbers because comparisons on those numbers may then be carried out in the same order of magnitude.

In an alternative embodiment, the processor may use encoded numbers of different bit lengths, such as 4-bit, 8-bit, and 256-bit numbers.

In another embodiment, the exponents may be biased to make room for lexicographical ordering to include the negative exponents. For example, the following exponent biases may be applied for the following numeric lengths:

TABLE 7

|  | $E_{MAX}$ | EXPONENT BIAS | $E_{MAX-BIASED}$ |
|---|---|---|---|
| DECIMAL32 | 96 | 101 | 197 |
| DECIMAL64 | 384 | 398 | 782 |
| DECIMAL128 | 6144 | 6176 | 12320 |

By biasing exponents, the present invention preserves the integrity of bitwise comparison functions. A negative exponent value, when biased, is represented by an exponent value that is lower than a biased positive exponent value. Thus, a bitwise comparison between these values will indicate that the value with the positive exponent is greater than the value with the negative exponent. For example, the unbiased exponent 3 of the number $2.00000000000000 \ 10^3$ may be biased to yield an biased exponent of 401.

In yet another alternative embodiment, the inverse shift operations of the encoding methods may follow the formula:
Depending on sign(D) the following transformations to the exponent and significand may be performed:

If $D<0$ then $e_{biased} \rightarrow (e_{max-biased}+3-e_{biased})$ and $m \rightarrow (m_{max}-m)$ If $D>=0$ then $e_{biased} \rightarrow e_{biased}$ and $m \rightarrow m$ Example $-1.700000000000001 \ 10^{-1}$ $e_{biased} \rightarrow (e_{max-biased}+3-e_{biased}) = (782+3-397) = 388$ $m \rightarrow (m_{max}-m) = (9999999999999999 - 1700000000000001) = 8299999999999998$ Hence, the number to be encoded may be: $8.299999999999998 \ 10^{388}$. The inverse shifts may be performed to preserve the lexicographical ordering of negative numbers.

In another embodiment, the SPF number may be constructed by placing, from most significant to least significant byte, the sign field, LE field, and exponent-significand field. For example, the number $2.000000000000000 \ 10^{401}$ in Table 2 may be represented by the bit pattern 1 100 0000001100 0000000000 0000000000 . . . bit-wise comparison functions, such as memcmp( ), may easily compare SPF numbers by performing a simple bit-wise check to see whether a first number is less than equal to, or greater than a second number.

In yet another embodiment, a separate scale variable may be used to store the scale of a number. The scale may correspond to the precision of the number. For example, the number $2.000000 \ 10^{401}$ may have a scale of 6. This scale may be stored in a separate variable as shown below.

TABLE 8

| | WIDTH | | | |
|---|---|---|---|---|
| | 1 BIT | L BITS | K * 10 BITS | |
| FIELD | S | $L_E$ | EXPONENT-SIGNIFICAND | SCALE |
| Bit string | 1 | 100 | 0000001100 0000000000 0000000000 . . . | 110 |
| decimal representation | | 4 | 012 000 000 . . . (value of triples) | 6 |

Storing the scale in a separate variable permits SFP numbers to be distinguished based on their scale. For example, 10 may be distinguished from 10.0.

In other embodiments, the first value-to-BCD transformation may be the inverse of the first BCD-to-value transformation. Since the BCD-to-value transformation encodes the first digit of an exponent-significand field as a binary bit pattern, the inverse value-to-BCD transformation converts the binary representation to a BCD bit pattern. Likewise, the second value-to-BCD transformation may be the inverse of the second BCD-to-value transformation.

Similarly, the unbias shifting operation of the general decoding method may be the inverse of the bias shifting operation of the general encoding method. Since exponents and significands may be shifting if the sign of the original number is negative, the unbiasing operation may restore the number to its original form.

In other embodiments, unused bit patterns of the general format may be used to encode the non-numbers, such as infinity, +/-SNaN, and +/-NaN. Likewise, unused bit patterns may be used to encode representations for the number 0. Refer to the table below for further illustrative examples.

TABLE 9

|  | DECIMAL32 | DECIMAL64 | DECIMAL128 |
|---|---|---|---|
| NAN | 0xFDE00000 | 0xFD480000000000 | 0xFB3980000000000000000000000000 |
| SNAN | 0xFD700000 | 0xFD200000000000 | 0xFB3700000000000000000000000000 |
| INFINITY | 0xFD6FFFFF | 0xFCFC00000000000 | 0xFB3480000000000000000000000000 |
| −INFINITY | 0x00AFFFFF | 0x0050000000000000 | 0x0005000000000000000000000000000 |
| −SNAN | 0x00A00000 | 0x0028000000000000 | 0x0002800000000000000000000000000 |
| −NAN | 0x00000000 | 0x0000000000000000 | 0x0000000000000000000000000000000 |

In some embodiments, a separate scale variable may be used to track the precision of the numbers. In other embodiments, the scale may be encoded in unused space in the encoded format.

Either big endian, little endian, or other byte-orderings may be used. Also, the algorithm may be used to encode and manipulate numbers of other formats, such as conversion to decimal, binary, BCD, or the like.

The following represents a more detailed description of aspects of the present invention. An example of applying the exemplary BCD-to-value transformation follows.

The first example converts a BCD digit triple into its binary equivalent bit pattern.

$$val(bin(d_i d_{i+1} d_{i+2})) = val(bcd(d_i d_{i+1} d_{i+2})) - (val(bcd(d_i d_{i+1} d_{i+2})) \text{DIV } 256)*156(val(bcd(d_{i+1} d_{i+2})) \text{DIV } 16)*6.$$

Example

Let the BCD-bit-pattern in memory be $bcd(d_i\ d_{i+1}\ d_{i+2})$=0x123 (12-bit long) and hence $bcd(d_{i+1}\ d_{i+2})$=0x23

Evaluating the BCD-bit patterns as a decimal number may yield:

$$val(bcd(d_i d_{i+1} d_{i+2})) = val(0x123) = 291$$

$$val(bcd(d_{i+1} d_{i+2})) = val(0x23) = 35$$

Computing the right-hand-side of the formula may yield:

$$(val(bcd(d_i d_{i+1} d_{i+2})) \text{DIV } 256)*156 = (291 \text{ DIV } 256)*156 = 156$$

(DIV denotes the integer division, i.e. it takes only the integer part)

$$(val(bcd(d_i d_{i+1} d_{i+2})) \text{DIV } 16)*6 = (35 \text{ DIV } 16)*6 = 2*6 = 12$$

$$val(bin(d_i d_{i+1} d_{i+2})) = 291 - 156 - 12 = 123$$

the binary bit-pattern is $bin(d_i\ d_{i+1}\ d_{i+2})$=0x7B=0111 1011

A second example converts two BCD digits into their binary equivalent bit pattern.

$$val(bin(e_0 e_1)) = val(bcd(e_0 e_1)) - (val(bcd(e_0 e_1)) \text{DIV } 16)*6$$

Example

Let the BCD-bit-pattern in memory be $bcd(e_0\ e_1)$=0x12

$$val(bcd(e_0 e_1)) = val(0x12) = 18$$

Computing the right hand side of the formula may yield:

$$(val(bcd(e_0 e_1)) \text{DIV } 16)*6 = (18 \text{ DIV } 16)*6 = 1*6$$

$$val(bin(e_0 e_1)) = 18 - 6 = 12$$

the binary bit-pattern is bin( )=0x7B=0111 1011

Likewise, an example applying the value-to-BCD transformation may be shown as follows.

A third example converts a binary bit pattern into its equivalent BCD digit triple.

$$val(bcd(d_i d_{i+1} d_{i+2}))_2 = val(bin(d_i d_{i+1} d_{i+2})) + (val(bin(d_i d_{i+1} d_{i+2})) \text{DIV } 100)*156 + (val(bin(d_{i+1} d_{i+2})) \text{DIV } 10)*6$$

Example

Let the binary declet bit-pattern in memory be $bin(d_i\ d_{i+1}\ d_{i+2})$=0x2A5 (10-bit long)

Evaluating the binary declets as a decimal may yield:

$$val(bin(d_i d_{i+1} d_{i+2})) = 677$$

$$val(bin(d_{i+1} d_{i+2})) = 77$$

Computing the right hand side of the formula may yield:

$$(val(bin(d_i d_{i+1} d_{i+2})) \text{DIV } 100)*156 = (677 \text{ DIV } 100)*156 = 6*156 = 936$$

$$(val(bin(d_{i+1} d_{i+2})) \text{DIV } 10)*6 = (77 \text{ DIV } 10)*6 = 7*6 = 42$$

$$val(bcd(d_i d_{i+1} d_{i+2})) = 677 + 936 + 42 = 1655$$

the bit-pattern of 1655 is 0x677 which is exactly the bcd bit-pattern of 677.

A fourth example converts a binary bit pattern into its equivalent two BCD digits bit pattern.

$$val(bcd(e_0 e_1)) = val(bin(e_0 e_1)) + (val(bin(e_0 e_1)) \text{DIV } 10)*6,$$

Example

Let the binary pattern in memory be $bin(e_0\ e_1)$=0x23

$$val(bin(e_0 e_1)) = 35$$

Computing the right hand side of the formula may yield:

$$+(val(bin(e_0 e_1)) \text{DIV } 10)*6 = (35 \text{ DIV } 10)*6 = 3*16 = 18$$

$$val(bcd(e_0 e_1)) = 35 + 18 = 53$$

the bit-pattern of 53 is 0x35 is exactly the bcd bit-pattern of 35.

The following examples show an illustration of biasing a declet during the variable-length encoding method.

For decimal128→p may equal 34
For decimal64→p may equal 16
For decimal32→p p may equal 7

If the input number is positive, the biasing formula may read as follows:

$$val((d_{i+2}, d_{i+1}, d_i)) \rightarrow val(d_{i+2}, d_{i+1}, d_i) + p \text{ DIV } 3 + 1$$

Example

Let $val((d_{i+2}, d_{i+1}, d_i)$ be a declet with the decimal value of 567 and p=34 then compute $$val(d_{i+2},d_{i+1},d_i)_2 + p \text{ DIV } 3+1 = 567+34 \text{ DIV } 3+1 = 567+11+1 = 579$$

If the input number is negative, the formula may read as follows:

$$val(d_{i+2},d_{i+1},d_i) \rightarrow 999-val(d_{i+2},d_{i+1},d_i), \text{where}$$

Example

Let $val((d_{i+2}, d_{i+1}, d_i))=567$, then compute $$999-val(d_{i+2},d_{i+1},d_i)=999-567=432$$

The following table contains example encodings of SFP numbers.

Table of encoded decimal64 numbers (precision=16, $e_{max}=384$):

TABLE 10

| Number | memory content | Memcmp |
|---|---|---|
| $m_{max} 10^{emax}$ | fc f7 e7 f9 fe 7f 9f e7 | |
| $2.0\ 10^3$ | c0 30 00 00 00 00 00 00 | >0 |
| $1.9\ 10^3$ | c0 2f 84 00 00 00 00 00 | >0 |
| $1.9\ 10^2$ | c0 07 84 00 00 00 00 00 | >0 |
| $1.899999999999999\ 10^2$ | c0 07 83 f9 fe 7f 9f e7 | >0 |
| $1.8\ 10^2$ | c0 07 20 00 00 00 00 00 | >0 |
| $1.800000000000001\ 10^0$ | bf 57 20 00 00 00 00 01 | >0 |
| $1.8\ 10^0$ | bf 57 20 00 00 00 00 00 | >0 |
| $1.8\ 10^{-1}$ | bf 2f 20 00 00 00 00 00 | >0 |
| $1.799999999999999\ 10^{-1}$ | bf 2f 1f f9 fe 7f 9f e7 | >0 |
| $1.0\ 10^{-383}$ | 82 5c 00 00 00 00 00 00 | >0 |
| $0.9999999999999999\ 10^{-383}$ | 82 57 e7 f9 fe 7f 9f de | >0 |
| $m_{min} 10^{-emax+1}$ | 80 28 00 00 00 00 00 01 | >0 |
| $0.0\ 10^0$ | 80 00 00 00 00 00 00 00 | >0 |
| $-m_{min} 10^{-emax+1}$ | 7d 6b e7 f9 fe 7f 9f e7 | >0 |
| $-1.7\ 10^{-2}$ | 3e 09 2b f9 fe 7f 9f e7 | >0 |
| $-1.7\ 10^{-1}$ | 3d e1 2b f9 fe 7f 9f e7 | >0 |
| $-1.700000000000001\ 10^{-1}$ | 3d e1 2b f9 fe 7f 9f e6 | >0 |
| $-1.799999999999999\ 10^{-1}$ | 3d e0 c8 00 00 00 00 00 | >0 |
| $-1.8\ 10^{-1}$ | 3d e0 c7 f9 fe 7f 9f e7 | >0 |
| $-1.8\ 10^0$ | 3d b8 c7 f9 fe 7f 9f e7 | >0 |
| $-1.799999999999999\ 10^2$ | 3d 68 c8 00 00 00 00 00 | >0 |
| $-1.8\ 10^2$ | 3d 68 c7 f9 fe 7f 9f e7 | >0 |
| $-1.800000000000001\ 10^2$ | 3d 68 c7 f9 fe 7f 9f e6 | >0 |
| $-1.9\ 10^3$ | 3d 40 63 f9 fe 7f 9f e7 | >0 |
| $-m_{max} 10^{emax}$ | 00 78 00 00 00 00 00 00 | >0 |

Turning to the optional variable-length encoding, The size of the variable-width format may be given as follows:

$$\text{Size}=12+I+(k-val(Z))*10 \text{ bits if } D>=0$$

$$\text{Size}=12+I+(k-val(Z)+1000)*10 \text{ bits if } D<0$$

Hence, to determine the size of the format, we need the number of the trailing zero-declets. This number can be retrieved by the following algorithm:

Start at bit position I+12
Get the declet value declet$_i$

1. If D>=0 and val(declet$_i$)<=p DIV 3 then val(declet$_i$)=val(Z)
2. If D<0 and val(declet$_i$)>=1000 then val(declet$_i$)=val(Z)
3. If p DIV 3<val(declet$_i$)<1000 then i→i+1

If i<k−1 go to 2.
Where I represents the length of the leading exponent field and k represents the number of declets of the corresponding, fixed-size representation.

The following represents examples of variable-length encoded SFP numbers.

TABLE 11

| Number | memory content (in hex) | memcmp |
|---|---|---|
| $m_{max} 10^{emax}$ | FB 34 7F 3F CF F3 FC FF 3F CF F3 FC FF 3F CF F3 | |
| $2.0\ 10^3$ | BD C5 80 B0 | >0 |
| $1.9\ 10^3$ | BD C5 F9 00 28 | >0 |
| $1.9\ 10^2$ | BD C3 79 99 28 | >0 |
| $1.8999\ldots 10^2$ | BD C3 78 FF CF F3 FC FF 3F CF F3 FC FF 3F CF F3 | >0 |
| $1.8\ 10^2$ | BD C3 72 C0 28 | >0 |
| $1.80000\ldots 1\ 10^0$ | BD BE 72 C0 30 0C 03 00 C0 30 0C 03 00 C0 30 0D | >0 |
| $1.8\ 10^0$ | BD BE 72 C0 28 | >0 |
| $1.8\ 10^{-1}$ | BD BB F2 C0 28 | >0 |
| $1.799999\ldots 10^{-1}$ | BD BB F2 BF CF F3 FC FF 3F CF F3 FC FF 3F CF F3 | >0 |
| $1.7\ 10^{-1}$ | BD BB EC 80 28 | >0 |
| $1.70000\ldots 1\ 10^{-2}$ | BD B9 6C 80 30 0C 03 00 C0 30 0C 03 00 C0 30 0D | >0 |
| $1.7\ 10^{-2}$ | BD B9 6C 80 28 | >0 |
| $m_{min} 10^{-emax+1}$ | 80 52 80 C0 30 0C 03 00 C0 30 0C 03 00 C0 30 0D | >0 |
| $0.0\ 10^0$ | 80 00 00 C0 | >0 |
| $-m_{min} 10^{-emax+1}$ | 7B 3B FE 7F 9F E7 F9 FE 7F 9F E7 F9 FE 7F 9F E7 | >0 |
| $-1.7\ 10^{-2}$ | 3D CC 92 BF C8 | >0 |
| $-1.7\ 10^{-1}$ | 3D CA 12 BF C8 | >0 |
| $-1.70000\ldots 1\ 10^{-1}$ | 3D CA 12 BF 9F E7 F9 FE 7F 9F E6 | >0 |
| $-1.799999\ldots 10^{-1}$ | 3D CA 0C 80 00 00 00 00 00 00 00 00 00 00 | >0 |
| $-1.8\ 10^{-1}$ | 3D CA 0C 7F C8 | >0 |
| $-1.8\ 10^0$ | 3D C7 8C 7F C8 | >0 |
| $-1.799999\ldots 10^2$ | 3D C2 8C 80 00 00 00 00 00 00 00 00 00 00 | >0 |
| $-1.8\ 10^2$ | 3D C2 8C 7F C8 | >0 |
| $-1.80000\ldots 1\ 10^2$ | 3D C2 8C 7F 9F E7 F9 FE 7F 9F E6 | >0 |
| $-1.9\ 10^2$ | 3D C2 86 3F C8 | >0 |
| $-m_{max} 10^{emax}$ | 00 07 80 00 00 00 00 00 00 00 00 00 00 00 | >0 |

As noted, the foregoing embodiments find application for recoding numbers coded according to the IEEE754R format. The basic IEEE 754R format consists of 4 fields:

1-bit sign field S.
5-bit "combination field" G which contains two leading exponent digits and one leading significand digit.
8/10/14-bit "following exponent field" F (for decimal32/decimal64/decimal128 formats) which contains the remaining exponent digits.
20/50/110-bit trailing significand field T of densely packed declets (DPD) containing 3 decimal BCD digits. The bcd digits are right-aligned.

TABLE 12

| | WIDTH | | | |
|---|---|---|---|---|
| | 1 BIT | 5 BITS | 6/8/12 BITS | 20/50/110 BITS |
| Field | S | G | F | trailing significand T |
| Bitstring | S | $G_0 \ldots G_4$ | $F_2 \ldots F_{w+1}$ | $DPD(d_{3*k-3}, d_{3*k-2}, d_{3*k-1})^{k-Z}{}_{10} \ldots DPD(d_2, d_1, d_0)^1{}_{10}$ |

TABLE 12-continued

| | WIDTH | | | |
|---|---|---|---|---|
| | 1 BIT | 5 BITS | 6/8/12 BITS | 20/50/110 BITS |
| most/least significand bit | | msb . . . lsb | msb . . . lsb | msb . . . lsb |

The three fields S, G, T destroy the byte-wise binary sortability of the IEEE 754R encoding. Because exponent data is distributed across both the G and F fields but can be interrupted by significand values also contained in the G field, a bitwise comparison of two numbers is not possible. Furthermore, the property to store scale information also can prevent a sortable encoding.

Embodiments of the present invention propose to recode IEEE754R into the SFP format described above. To recode this data, exponent values from the G and F fields are reorganized into a continuous exponent field. Similarly, significand data from the G and T fields are reorganized into a continuous significand field. The exponent values are appended to the significand values with the exponent value occupying more significant bit positions than the significand values. Having reorganized the data as such, the data is amenable for transformation as discussed hereinabove.

The following represents a preferred encoding method of the present invention. An example showing the encoding of the 64-bit, 754 number $2000.000000000000 \; 10^{-1}$ helps to clarify this embodiment.

According to the IEEE 754R specification, subpatterns of twelve bits (representing three 4-bit BCD digits) are compressed into subpatterns of ten bits called densely packed declets ("DPD"). In a first step 900, a transformation may be applied to decompress the DPD's into their 4-bit BCD digit triples. Reference may be made to the IEEE 754R specification for examples of the decompression transformation. In step 902, the resulting decompressed 754 number may be normalized according to the description above. The normalization step may fix the raddix point to yield one digit of the significand to the left of the raddix point and the remaining digits to the right. The normalization step may also alter the exponent to preserve the original value of the number as the raddix point is moved. For example, the number $2000.000000000000 \; 10^{-1}$ may be normalized to yield $2.000000000000000 \; 10^{3}$. Normalization permits the exponents of the present invention to be properly compared in the encoded format. Although, the normalization step may be optional if numbers arrive to be encoded having already been normalized.

In step 904, the sign of the 754 number may be converted to the sign of the SFP format. If the 754 number is negative, the sign may be 0. Otherwise, the sign may be 1.

In step 906, the exponent may be biased to permit lexicographic ordering of the negative exponents without the need for storing a separate sign for the exponent. An exponent bias value of 398 may be added to the exponent. For example, the exponent of 3 may become 401. In another example, an exponent of −397 may become 1.

In step 908, shift operations may be performed on the exponent and significand to further preserve lexicographic ordering of the number. This shift may be performed if the sign of the 754 number is negative. Reference may be made above for an example of this shift operation. In the current example, since the exponent-biased number $2.000000000000000 \; 10^{401}$ is positive, the shift operation may be skipped.

In step 910, a leading exponent field may be created by extracting the first digit(s) of the exponent and encoding it in the correct number of bits. In this example, the first BCD digit of the exponent is 0100, or 4. According to the preferred embodiment, the leading exponent field of 64-bit numbers may contain three bits. Retrieving the three least significant bits of the BCD bit pattern for 4 may yield 100. Thus, the leading exponent field may be 100.

In step 912, an exponent-significand field may be created by grouping the remaining digits of the exponent and the significand into digit triples and transforming those triples into declets. In the example, the remaining BCD digits of the exponent are 0000 and 0001, or the digits 0 and 1. The significand contains the BCD digits 0010, 0000, 0000, . . . , or the digits 2, 0, 0, . . . . Grouping the exponent and significand digits may yield the first BCD digit triple of 0000 0001 0010, or 0 1 2. The next triple may be 0000 0000 0000, or 0 0 0. The remaining triples may likewise have zero values.

A transformation may be applied to each digit triple as described above. For example:

Since the first digit of the BCD digit triple is 0, a two digit transformation may be applied.

$$val(bin(e_0 e_1)) = val(bcd(e_0 e_1)) - (val(bcd(e_0 e_1)) \; \text{DIV} \; 16) * 6$$

Example

Let the BCD-bit-pattern in memory be $bcd(e_0 \; e_1) = 0x12$ $$val(bcd(e_0 e_1)) = val(0x12) = 18$$

$$(val(bcd(e_0 e_1)) \; \text{DIV} \; 16) * 6 = (18 \; \text{DIV} \; 16) * 6 = 1 * 6$$

$$val(bin(e_0 e_1)) = 18 - 6 = 12$$

the binary bit-pattern of the resulting declet may be 0000001100.

Since the remaining BCD triples are 0's, the resulting binary declets may also be 0.

Finally, in step 914, the sign, leading exponent field, and exponent-significand field may be arranged, from most to least significant bit, by concatenating the sign field, followed by the leading exponent field, followed by the exponent-significand field. This may yield:

TABLE 13

| | WIDTH | | |
|---|---|---|---|
| | 1 BIT | L BITS | K * 10 BITS |
| Field | S | $L_E$ | EXPONENT-SIGNIFICAND |
| Bit string | 1 | 100 | 0000001100 0000000000 0000000000 . . . |

Several embodiments of the present invention are specifically illustrated and described herein. However, it will be appreciated that modifications and variations of the present invention are covered by the above teachings and within the purview of the appended claims without departing from the spirit and intended scope of the invention.

What is claimed is:

1. A computer-implemented storage method, comprising:
responsive to a number received according to IEEE754,
assembling, by a processor, a continuous exponent field from a combination field (G) and following exponent field (F) thereof and assembling a significand field from the combination field and from a trailing significand field,
concatenating, by the processor, the significand field to the exponent field, wherein data of the exponent field occupies more significant bit positions as compared to the positions of the significant field,
organizing, by the processor, consecutive BCD values of the concatenated fields into BCD triplets,
for each consecutive triplet of BCD values, transforming, by the processor, the triplet into binary valuations of the decimal number represented by the triplet, each transformed triplet yielding a binary declet,
transforming, by the processor, any remaining BCD values not included in a triplet into a binary valuation, and
storing, by the processor, the transformed binary valuation in a memory along with a representation of the number's sign.

2. The storage method of claim 1, further comprising:
compressing the binary valuations by omitting from the number trailing declets having zero value and including a length field to identify the number of declets so omitted.

3. The storage method of claim 1, wherein a bit length of a transformed number is no greater than a bit length of the input number.

4. The storage method of claim 1, further comprising:
prior to the transforming the triplet into binary valuations, adding a bias to the exponent value to accommodate negative exponent values without requiring an exponent sign.

5. The storage method of claim 1, further comprising:
prior to the transforming the triplet into binary valuations, adding a bias to the significand value to accommodate negative significand values.

6. A computer-implemented sorting method, comprising:
responsive to a pair of numbers received according to IEEE754, for each number:
assembling, by a processor, a continuous exponent field from a combination field (G) and following exponent field (F) thereof and assembling a significand field from the combination field and from a trailing significand field,
concatenating, by the processor, the significand field to the exponent field, wherein data of the exponent field occupies more significant bit positions as compared to the positions of the significant field,
organizing, by the processor, consecutive BCD values of the concatenated fields into BCD triplets,
for each consecutive triplet of BCD values, transforming, by the processor, the triplet into binary valuations of the decimal number represented by the triplet, each transformed triplet yielding a binary declet,
transforming, by the processor, any remaining BCD values not included in a triplet into a binary valuation, and
storing, by the processor, the transformed binary valuation in a memory along with a representation of the number's sign;
performing, by the processor, a bitwise comparison of the two numbers; and
in response to the bitwise comparison, outputting, by the processor, the two numbers according to a sort order.

7. A computer-readable non-transitory storage medium stored thereon executable instructions that when executed perform a storage method, the storage method includes:
responsive to a number received according to IEEE754,
assembling a continuous exponent field from a combination field (G) and following exponent field (F) thereof and assembling a significand field from the combination field and from a trailing significand field,
concatenating the significand field to the exponent field, wherein data of the exponent field occupies more significant bit positions as compared to the positions of the significant field,
organizing consecutive BCD values of the concatenated fields into BCD triplets,
for each consecutive triplet of BCD values, transforming the triplet into binary valuations of the decimal number represented by the triplet, each transformed triplet yielding a binary declet,
transforming any remaining BCD values not included in a triplet into a binary valuation, and
storing the transformed binary valuation in a memory along with a representation of the number's sign.

8. A computer-readable storage non-transitory medium stored thereon executable instructions that when executed perform a sorting method, the sorting method includes:
responsive to a pair of numbers received according to IEEE754, for each number:
assembling a continuous exponent field from a combination field (G) and following exponent field (F) thereof and assembling a significand field from the combination field and from a trailing significand field,
concatenating the significand field to the exponent field, wherein data of the exponent field occupies more significant bit positions as compared to the positions of the significant field,
organizing consecutive BCD values of the concatenated fields into BCD triplets,
for each consecutive triplet of BCD values, transforming the triplet into binary valuations of the decimal number represented by the triplet, each transformed triplet yielding a binary declet,
transforming any remaining BCD values not included in a triplet into a binary valuation, and
storing the transformed binary valuation in a memory along with a representation of the number's sign;
performing a bitwise comparison of the two numbers; and
in response to the bitwise comparison, outputting the two numbers according to a sort order.

* * * * *